United States Patent
Hanley

[11] Patent Number: 5,908,504
[45] Date of Patent: Jun. 1, 1999

[54] METHOD FOR TUNING BARREL REACTOR PURGE SYSTEM

[75] Inventor: Thomas Martin Hanley, O'Fallon, Mo.

[73] Assignee: MEMC Electronic Materials, Inc., St. Peters, Mo.

[21] Appl. No.: 08/530,612

[22] Filed: Sep. 20, 1995

[51] Int. Cl.[6] .................................................. C30B 25/16
[52] U.S. Cl. ........................... 117/86; 117/102; 117/202; 118/715
[58] Field of Search .............................. 117/202, 86, 102; 118/715

[56] References Cited

U.S. PATENT DOCUMENTS

| | | | |
|---|---|---|---|
| 4,632,060 | 12/1986 | Goto et al. ................................ | 118/730 |
| 4,728,389 | 3/1988 | Logar ....................................... | 156/612 |
| 4,928,626 | 5/1990 | Carlson et al. ........................... | 118/715 |
| 5,279,986 | 1/1994 | Maloney et al. . | |
| 5,298,107 | 3/1994 | Scudder et al. . | |
| 5,316,794 | 5/1994 | Carlson et al. ........................ | 427/248.1 |
| 5,332,443 | 7/1994 | Chew et al. . | |
| 5,345,999 | 9/1994 | Hosokawa . | |
| 5,352,636 | 10/1994 | Beinglass . | |
| 5,355,066 | 10/1994 | Lowrance . | |
| 5,365,772 | 11/1994 | Ueda et al. ............................... | 118/715 |
| 5,578,132 | 11/1996 | Yamaga et al. .......................... | 118/715 |
| 5,616,208 | 4/1997 | Lee ......................................... | 118/715 |
| 5,624,499 | 4/1997 | Mizuno et al. .......................... | 118/715 |

FOREIGN PATENT DOCUMENTS 0 272140 A2 6/1988 European Pat. Off. .

*Primary Examiner*—Robert Kunemund
*Attorney, Agent, or Firm*—Senniger, Powers, Leavitt & Roedel

[57] ABSTRACT

A method for tuning a purge system of a barrel reactor used for chemical vapor deposition of layers of material on semiconductor wafers includes placement of rotameters and adjustable flow-control valves in each of multiple purge lines. The flow rates of purge gas in the lines are monitored and the valves adjusted to make sure that the flow is all in a direction toward the barrel reactor, so that there is no siphon effect to draw reactant gases into the purge system. The oxygen presence in the barrel reactor is also monitored and the flow rates adjusted to reduce the oxygen presence. The flow rates are adjusted to assure full purge of reactant gases from the barrel reactor after a chemical vapor deposition cycle is complete. Reduced levels of metals contamination in layers of deposited material are achieved.

19 Claims, 3 Drawing Sheets

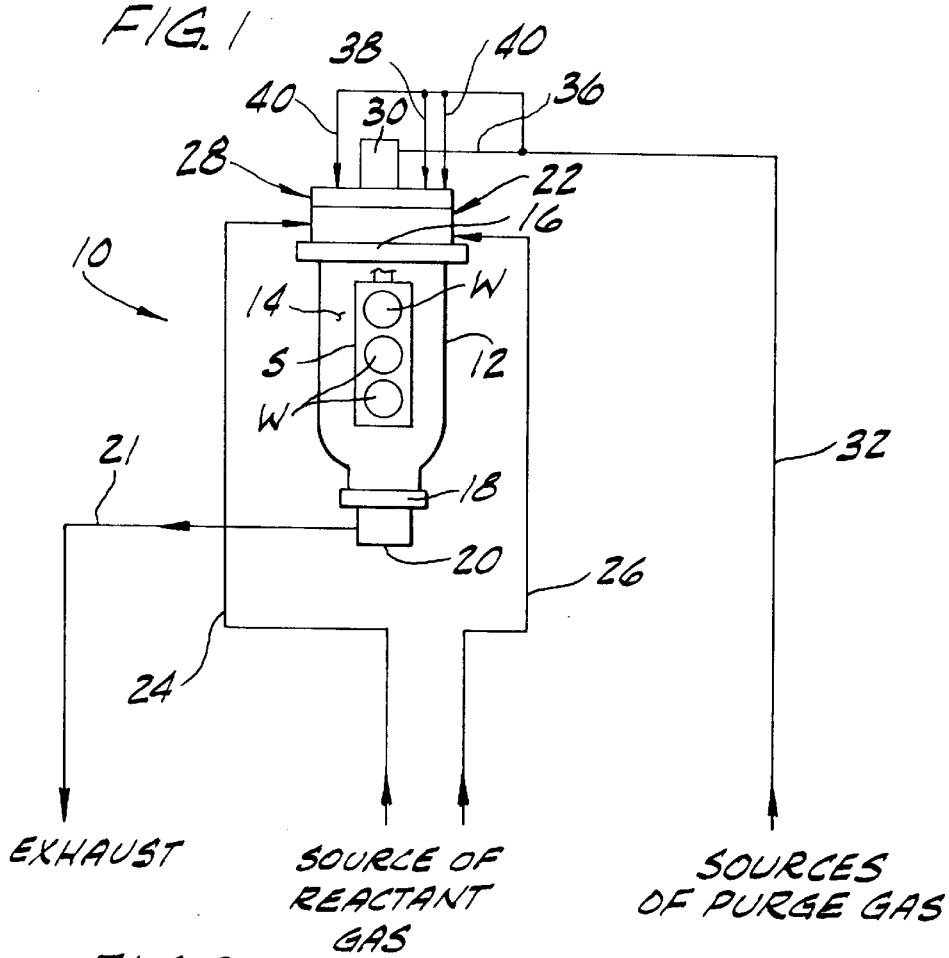
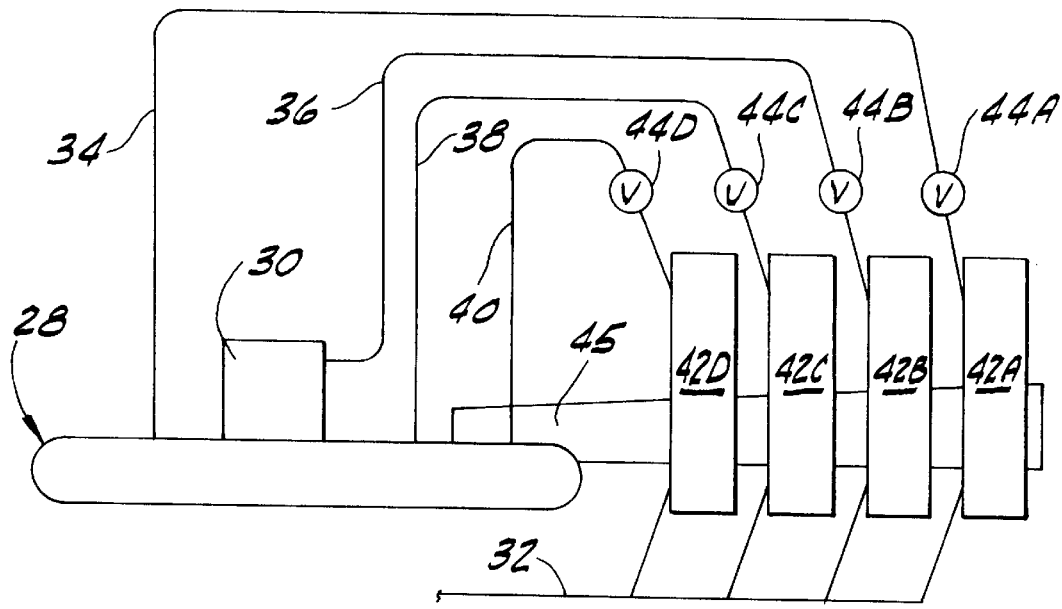

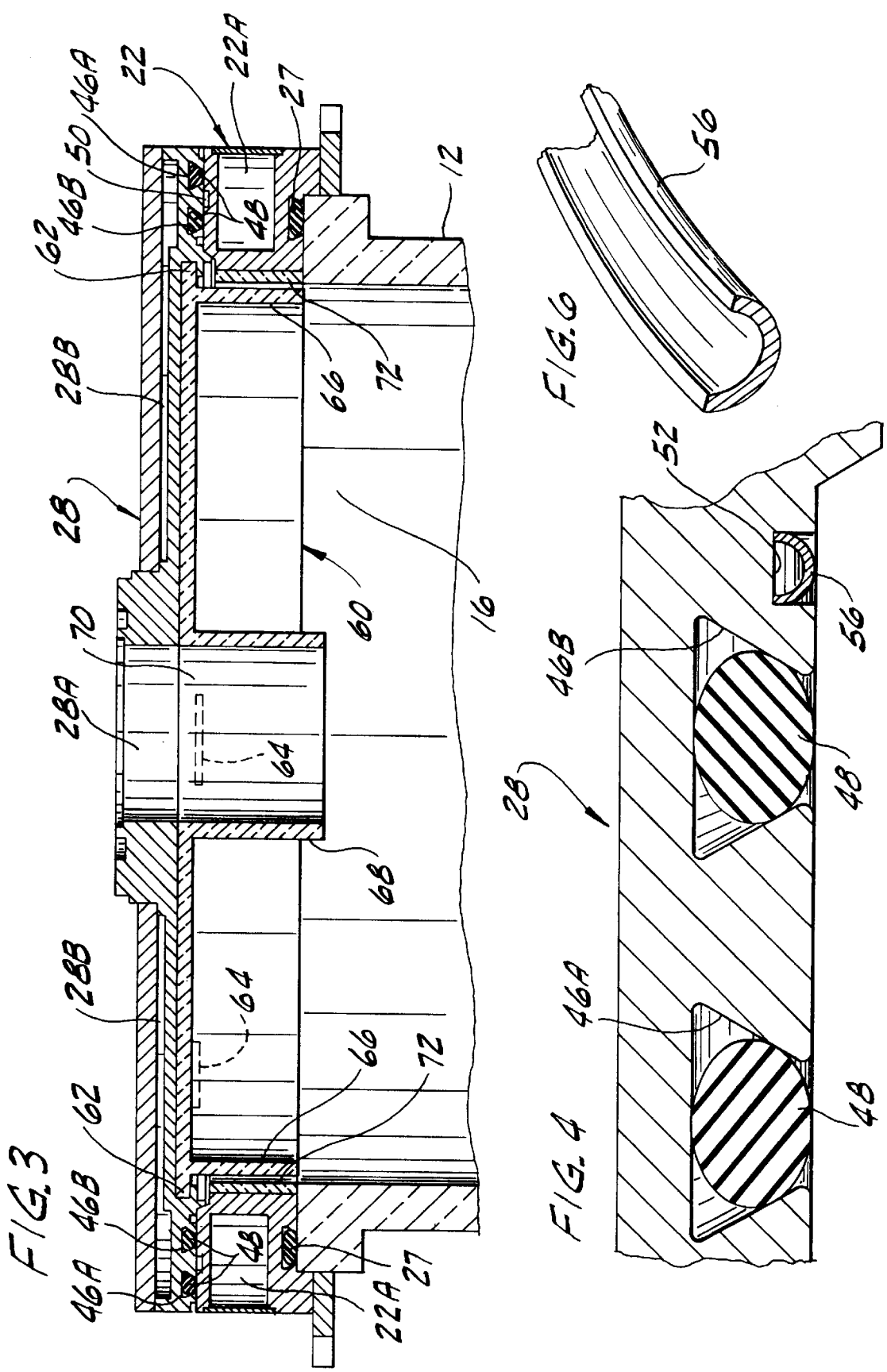

METHOD FOR TUNING BARREL REACTOR PURGE SYSTEM

BACKGROUND OF THE INVENTION

This invention relates generally to barrel reactors used to deposit material on a semiconductor wafer by chemical vapor deposition, and more particularly to a method for tuning a purge system of such a barrel reactor.

Barrel reactors of the type to which the present invention generally relates are used for deposition of epitaxial layers on semiconductor wafers. Epitaxy is an important process in the semiconductor material industry for achieving the necessary electrical properties of the semiconductor material. For example, a lightly doped epitaxial layer grown over a heavily doped substrate permits a CMOS device to be optimized for latch up immunity as a result of low resistance of the substrate. Other advantages, such as precise control of the dopant concentration profile and freedom from oxygen are also achieved.

Reactant gas carrying the material (e.g., silicon) to be deposited on the wafers is injected into a reaction chamber vessel of the barrel reactor where the deposition of the material onto the wafers is accomplished. Multiple wafers are held in a generally vertical orientation on walls of a susceptor so that one face of the wafer is exposed for deposition of silicon. The reaction chamber vessel is typically made of quartz. A seal plate which closes the reaction chamber, but can be moved to open the chamber for inserting or removing semiconductor wafers from the chamber, is made of stainless steel. A gas ring between the seal plate and reaction chamber is also made of stainless steel.

It is important that the layer of silicon deposited on the wafers not be contaminated with metals, such as iron, nickel and molybdenum, which can deleteriously affect the minority carrier lifetime of the epitaxial layer. The presence of non-metallic foreign particles in the layer is also to be avoided. The quartz reaction chamber vessel will not be a source of metals contamination, but the stainless steel in the seal plate and gas ring does provide a source for metals contamination. Contact with certain byproducts (e.g., HCl) of the reactant gas in the presence of residual moisture can cause the stainless steel to corrode. Corrosive agents such as HCl may also be present in the chamber as a result of it use to etch back deposits of silicon from the susceptor. Corrosion products from the stainless steel may be transported into the reaction chamber and become entrained with the reactant gas and material deposited on the wafers. Moreover, $SiO_2$ deposits formed on the stainless steel by a reaction of the reactant gas with residual oxygen in the barrel reactor must be cleaned. Otherwise, some of the $SiO_2$ can flake off and be deposited on the wafers.

To avoid contamination from the seal plate and gas ring, the barrel reactor is constructed to divert the flow of reactant gas away from the seal plate and gas ring by baffles and by a flow of purge gas over the areas of the seal plate and gas ring exposed to the reactant gas. The seal plate and gas ring are also water cooled. The conventional purge gas system comprises a single line of purge gas which branches off into multiple lines before reaching the seal plate for delivering purge gas to several different locations around the seal plate. The lines are connected to holes extending through the seal plate and opening on the underside of the seal plate for bathing in purge gas those areas of the seal plate and gas ring exposed to reactant gas.

In operation of a typical barrel reactor, the purge gas system is controlled by a microprocessor to first purge the seal plate and reaction chamber with nitrogen to rid the chamber of oxygen. Following the nitrogen purge, hydrogen is fed through the purge lines for several minutes prior to beginning the deposition cycle by the injection of reactant gas into the reaction chamber. The flow of hydrogen continues throughout the deposition cycle, and thereafter to purge reactant gas from the chamber. However before the seal plate is removed from the chamber, there is another nitrogen purge to remove hydrogen from the chamber.

The existing system of baffles and purge gas to avoid metals and particulate contamination from the stainless steel seal plate and gas ring is only partially successful. In particular, the purge systems are not adequate to purge substantially all of the oxygen and water vapor from the barrel reactor. As a result of the presence of oxygen (in the form of free oxygen or in the form of water vapor), significant deposits of $SiO_2$ are formed on the seal plate and gas ring during a deposition cycle which must be removed after only a few cycles of operation of the barrel reactor. It has been found that substantial deposits occur in locations between the gas ring and seal plate which are spaced farthest away from the purge gas line which delivers gas to purge the space between the seal plate and gas ring. The act of cleaning the $SiO_2$ deposits from the seal plate can cause corrosion of the seal plate. Any water introduced to the seal plate during cleaning which is not removed will promote reaction of the stainless steel with HCl. The shape of the seal plate often makes it difficult to remove all of the water.

In existing purge systems, the differences in pressure between the various purge lines can cause a siphon effect, in which reactant gases are actually drawn into one or more of the lines of the purge system and discharged against the seal plate. Often the reactant gas drawn in the system is ejected into a rotation mechanism of the seal plate, causing significant corrosion. Thus, rather than protecting the seal plate and gas ring from silicon deposits and corrosion, the purge system promotes their deterioration. In addition, the present systems do not adequately purge the reactant gas from the chamber after a deposition cycle. As a result, the stainless steel may react with HCl from the reactant gas when the reaction chamber is opened and moisture ladened air comes into contact with the seal plate.

SUMMARY OF THE INVENTION

Among the several objects and features of the present invention may be noted the provision of a method for tuning a purge system of a barrel reactor which protects against metals contamination in a layer of material deposited on semiconductor wafers in the barrel reactor; the provision of such a method which assures that no reactant gas is drawn into the purge system; the provision of such a method which results in substantially all of the oxygen and water vapor in the barrel reactor being removed by the purge system prior to the introduction of reactant gas into the barrel reactor; the provision of such a method which causes the purge system to distribute purge gas more uniformly over the areas of the barrel reactor requiring protection from reactant gas; the provision of such a method which reduces the down time of the barrel reactor required for cleaning; and the provision of such a method which is economical and easy to carry out.

Further among the several objects and features of the present invention may be noted the provision of a barrel reactor in which purge gas flows can be monitored and altered to optimize the operation of the purge gas system; and the provision of such a barrel reactor which distributes purge gas more uniformly over areas of the barrel reactor requiring protection from the reactant gas.

Other objects and features of the invention will be in part apparent and in part pointed out hereinafter.

BRIEF DESCRIPTION OF THE DRAWINGS

FIG. 1 is a simplified schematic of a barrel reactor showing its purge gas and reactant gas delivery lines;

FIG. 2 is a schematic of the barrel reactor seal plate and purge gas system showing flow meters and valves used to tune the system;

FIG. 3 is a fragmentary cross section of the seal plate and of the barrel reactor;

FIG. 4 is an enlarged fragmentary cross section of the right end of the seal plate of FIG. 3;

FIG. 6 is an enlarged, fragmentary perspective view of the gas containment annulus.

Corresponding reference characters indicate corresponding parts throughout the several views of the drawings.

DETAILED DESCRIPTION OF THE PREFERRED EMBODIMENT

Figure 5:
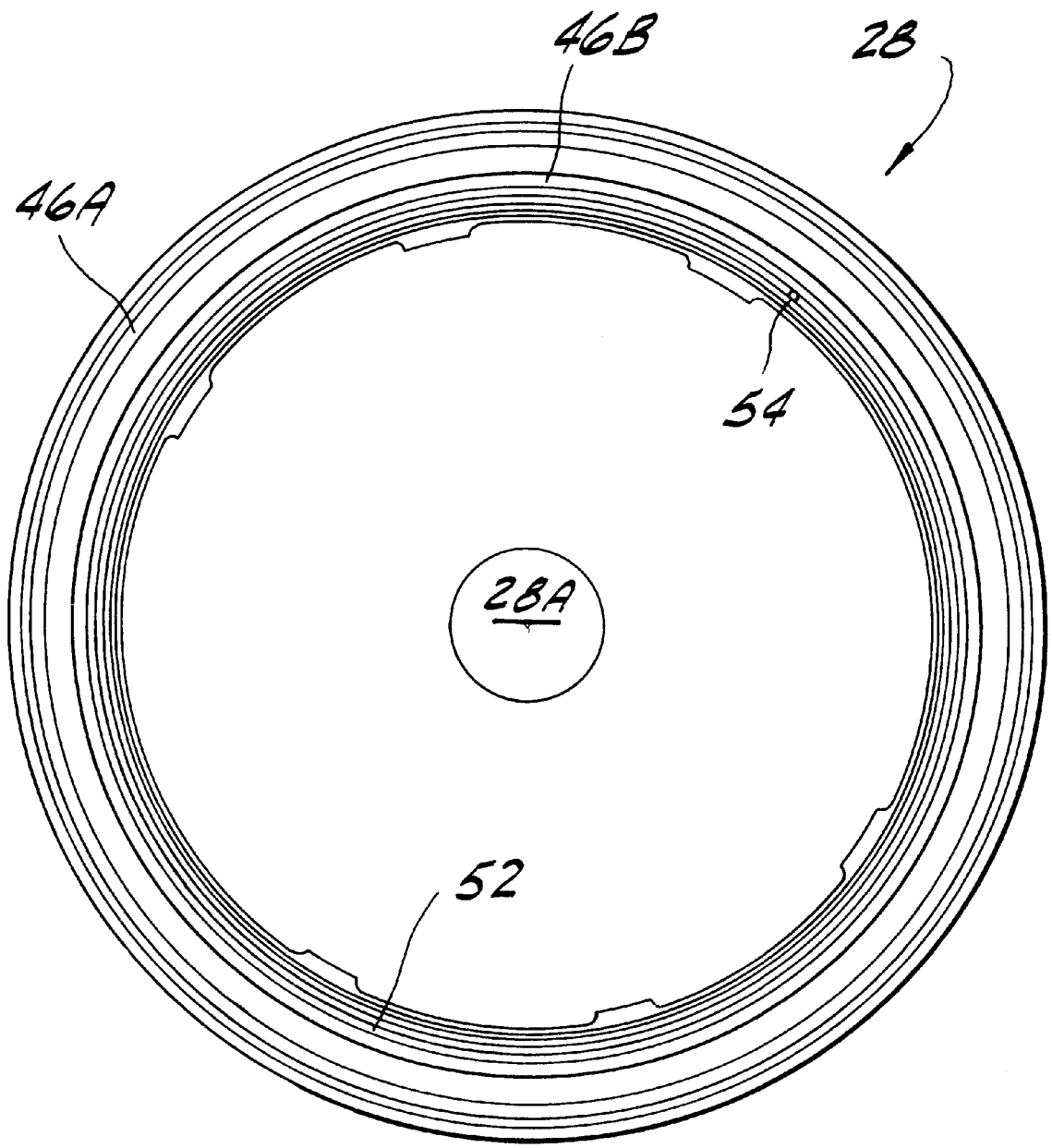
FIG. 5 is a bottom plan view of the seal plate with baffle plate, O-rings and a gas containment annulus of the seal plate removed.

Referring now to the drawings and in particular to FIG. 1, a barrel reactor indicated generally at 10 is of the type which is used to deposit material (e.g., silicon) on a semiconductor wafer W held on a susceptor S in the barrel reactor. The barrel reactor 10 includes a quartz reaction chamber vessel 12 defining a reaction chamber 14. The reaction chamber vessel 12 has an open top 16, and a port 18 at its bottom for exhausting gases from the reaction chamber 14. An exhaust fitting 20 is located in the port 18 for connecting an exhaust line 21 to the vessel 12. A gas ring (indicated generally at 22) made of stainless steel and located above of the reaction chamber vessel 12 permits access to the reaction chamber 14 for injection of reactant gas (e.g., $SiCl_4$, $SiHCl_3$, $SiH_2Cl_2$, or $SiH_4$) through a left injection line 24 and a right injection line 26 (broadly, "reactant gas delivery means"). The silicon in the gas is deposited on the wafers W by chemical vapor deposition. The gas ring 22 and reaction chamber vessel 12 are sealed to each other by an O-ring 27 disposed in the gas ring 22 and sealingly engaging the reaction chamber vessel 12 (FIG. 3).

The open top 16 of the reaction chamber vessel 12 is closed by a seal plate, generally indicated at 28, which is movable from an opened position (not shown) in which it is spaced away from the vessel and permits the insertion and removal of the susceptor S carrying the wafers W, and a closed position in which the seal plate sealingly engages the gas ring 22 to close the open top of the vessel and isolate the reaction chamber 14 from the surrounding environment. The seal plate 28 includes a rotation housing 30 carried by the seal plate which houses a rotation mechanism (not shown). The susceptor S supporting the wafers W is hung from the rotation mechanism for rotation of the susceptor during the deposition cycle of the barrel reactor 10.

A purge gas system of the barrel reactor 10 includes a single supply line 32 extending from sources of purge gas toward the top of the barrel reactor. As shown in FIGS. 1 and 2, the supply line 32 branches off into four purge gas lines, a left baffle purge line 34, a rotation housing purge line 36, a right baffle purge line 38 and a seal plate purge line 40, which are connected to the seal plate 28 at four spaced apart locations. The four purge gas lines 34–40 deliver purge gas to purge different regions of the seal plate 28. As shown in FIG. 2, appropriately sized rotameters (designated 42A–42D, respectively) are placed in each of the four purge gas lines 34–40 along with bellows metering valves (designated 44A–44D, respectively) which together permit monitoring and independent adjustment of the flow rate of purge gas through each of the four purge gas lines. In FIG. 2, the rotameters 42A–42D are schematically shown as mounted on a lift arm 45 of the barrel reactor 10 which is used to raise and lower the seal plate 28. The bellows metering valves 44A–44D may be broadly referred to as "flow regulators".

The seal plate 28 and gas ring 22 are shown in the closed position of the seal plate in FIG. 3. The rotation housing 30, rotation mechanism and susceptor S have been removed. However, it may be seen that the seal plate 28 has a central opening 28A through which the susceptor S is attached to the rotation mechanism. The seal plate 28 has an internal annular passage 28B through which water is circulated to cool the seal plate. A similar passage 22A is formed in the gas ring 22 for the purpose of circulating cooling water.

A quartz baffle plate indicated generally at 60 has a lip 62 which rests on tabs 64 (only two are shown) on the seal plate 28. The baffle plate 60 covers substantially all of the seal plate 28 which would otherwise be exposed to the gases in reaction chamber 14. An annular outer baffle 66 depends from the baffle plate 60 at a location inward of the perimeter of the baffle plate, and an annular inner baffle 68 depends from the baffle plate around a central opening 70 generally in registration with the central opening 28A of the seal plate. The inner baffle 68 helps to protect the hanger (not shown) connecting the susceptor S to the rotation mechanism. The radially inner face of the gas ring 22 is covered by a quartz ring 72. The baffle plate 60 and the quartz ring 72 have openings (not shown) through which reactant gas is injected into the reaction chamber 14 from the left and right injection lines 24, 26.

The left and right baffle purge gas lines 34, 38 deliver purge gas to purge the space between the outer baffle 66 and the quartz ring 72. The rotation housing purge gas line 36 delivers purge gas to the rotation housing 30, and down through the inner baffle 68. The seal plate purge gas line 40 delivers purge gas to a location between the gas ring 22 and seal plate 28 for purging the space between the two.

Referring now to FIGS. 3–5, the seal plate 28 has an annular surface which overlies a corresponding surface of the gas ring 22 when the seal plate is in its closed position (FIG. 3). A pair concentric annular channels (designated 46A and 46B, respectively) in the seal plate 28 contain O-rings 48 which engage the gas ring 22 in the closed position for sealing with the gas ring and isolating the reaction chamber 14 from the surrounding environment. A channel 50 in the gas ring 22 located between the O-rings 48 may be pumped down to a vacuum pressure for use in the detection of leaks in the seal of the reaction chamber 14. The seal plate 28 has an annular groove 52 which is concentric with the O-ring channels 46A, 46B but located radially inwardly from the inner of the two channels (46B). The seal purge gas line 40 opens at an orifice 54 into the annular groove 52 for supplying purge gas around the full 360° extension of the annular groove (FIG. 5).

Purge gas delivered to the annular groove 52 leaks from the groove into the reaction chamber 14 and is ultimately exhausted through port 18 at the bottom of the reaction chamber vessel 12. A gas containment annulus 56 is provided to contain the purge gas in the annular groove 52 long enough so that the entire groove is filled with purge gas. The containment annulus 56 is preferably a stainless steel ring having a generally U-shaped cross section (see FIG. 6). As shown in FIG. 4, the containment annulus 56 is sized in correspondence with the annular groove 52 so that it may be received in the annular groove. The containment annulus 56 is resilient so that it bears against the walls of the groove 52 for holding itself in the groove. The containment annulus 56 does not prevent the purge gas from leaking out of the groove 52 to the reaction chamber 14, but slows the rate of leakage so that the groove is flooded with purge gas during operation of the barrel reactor 10. Without the containment annulus 56, the purge gas tends to leak out of the groove 52 so quickly that not all of the groove is filled with purge gas. As a result, portions of the interface between the seal plate 28 and gas ring 22 would not be bathed in purge gas. The groove 52 itself may become a site for retaining oxygen and water vapor, which tend to accumulate at the top of the reaction chamber 14. In prior barrel reactors (not shown), it has been found that greater concentrations of $SiO_2$ accumulate on the portions of the seal plate/gas ring interface. However by employing the tuning method and containment annulus 56 of the present invention, more complete removal of oxygen and water vapor from the annular groove 52 is achieved prior to introduction of reactant gas into the reaction chamber 14.

It is to be understood that better distribution of gas in throughout the entire annular groove 52 could be achieved other than by insertion of the containment annulus 56 into the groove without departing from the scope of the present invention. For instance, a flat metal ring (not shown) could be welded onto the seal plate over the annular groove 52. Small holes would be pre-drilled through the ring to permit the purge gas to escape the groove 52 in a controlled fashion so as to keep the entire groove filled with purge gas.

The general operation of the barrel reactor 10 is well known to those of ordinary skill in the art. The susceptor S supporting the wafers W is hung from the rotation mechanism on the seal plate 28 while the seal plate is in its open position. The seal plate 28 is lowered by the lift arm 45 into sealing engagement with the gas ring 22, thereby simultaneously positioning the susceptor S in the reaction chamber 14 and sealing the chamber from the surrounding environment by engagement of the O-rings 48 of the seal plate with the gas ring. Purge gas is fed from one of the purge gas sources through the supply line 32 to the four purge gas lines 34–40 for purging oxygen and water vapor from the reaction chamber 14. The sequencing of the two purge gases (nitrogen and hydrogen) is described above, and is well known to those of ordinary skill in the art. Subsequently, reactant gas is delivered through the left and right injection lines 24, 26 and into the reaction chamber 14 for deposition of silicon carried by the gas in a layer on the wafers W. Purge gas continues to flow through the deposition cycle to deflect reactant gases from the seal plate 28 and gas ring 22. Upon completion of the deposition cycle, the flow of reactant gas is shut off, but the flow of purge gas continues to purge the reaction chamber 14 of reactant gases.

The method of the present invention for tuning the purge system includes the step of cutting each of the four purge gas lines 34–40 and connecting the rotameters 42A–42D and bellows metering valves 44A–44B in the lines. Of course, it would also be possible to initially manufacture the barrel reactor with the rotameters and bellows metering valves in the purge lines so that the lines would not have to be cut. The flow rates in each of the lines may now be readily monitored by inspecting the rotameters 42A–42D and changed by manipulating the bellows metering valves 44A–44D. Any existing flow restricting orifice (not shown) which may have been placed in the purge lines 34–40 by the manufacturer is removed. Purge gas is delivered from the supply line 32 into the four purge gas lines 34–40. Initially, the rotameters 42A–42D are monitored and the flow rates in one or more of the lines 34–40 are adjusted as needed to make sure that there is no siphoning or negative flow in any of the lines. In this way, it can be made certain that no reactant gas will enter the purge system.

The presence of oxygen and water vapor in the barrel reactor 10 is monitored and the flow rates of one or more of the purge lines 34–40 are adjusted by manipulation of the bellows metering valves 44A–44D so that the presence of oxygen and water vapor in the barrel reactor is minimal. In particular, the flow rate for the seal plate purge gas line 40 has been substantially increased over conventional settings to purge the oxygen and water vapor which tends to reside in the gap between the seal plate 28 and gas ring 22. However, the flow rate of purge gas should not be so high as to dilute the reactant gas to the extent that the thickness of the layer of silicon on the wafers is adversely affected. Typically, it will not be necessary to adjust the flow rates through the purge lines 34–40 after settings are reached which optimize the reduction in metal and particulate contamination. Accordingly, the bellows metering valves 44A–44D could be replaced with fixed orifices (not shown) sized to permit the same optimum flow rates as the bellows metering valves.

It is envisioned that instrumentation could be used to monitor the presence of oxygen and water vapor in the barrel reactor 10. However, in the present case, the presence of oxygen (in the form of free oxygen, and/or in water vapor) is determined by inspecting the seal plate 28 for deposition of $SiO_2$ following a deposition cycle of the barrel reactor 10. The presence of significant $SiO_2$ deposits indicates that oxygen was present at the location of the deposit for reacting with the silicon bearing reactant gas. The location of the $SiO_2$ also indicates which purge gas line has insufficient flow. It has been found that the most common site for $SiO_2$ deposition is between the gas ring 22 and seal plate 28. Therefore, the purge gas flow in seal plate purge line 40 is substantially increased. In addition, insertion of the gas containment annulus 56 into the annular groove in the seal plate 28 helps to distribute the gas from the seal plate purge line 40 more uniformly along the groove and between the seal plate and gas ring 22.

Reduction in the presence of $SiO_2$ deposits in the region of the seal plate 28 and gas ring 22 indicates that water vapor, which along with free oxygen tends to remain at the top of the reaction chamber 14, is being purged simultaneously with the free oxygen. Confirmation of this is made by examination of wafers W processed in the barrel reactor 10 to determine the level of metals contamination in the wafers. The presence of water will cause HCl (another byproduct of the reactant gas and oxygen) to react with the stainless steel, producing corrosion and metal contamination of the deposited layer. It is to be noted that HCl may also be present in the barrel reactor 10 because it is ordinarily used to etch back silicon deposited on the susceptor S. Moreover, the full removal of reactant gas from the reaction chamber 14 by the purge system following the end of the deposition cycle prevents reaction of HCl with the stainless steel from occurring when moisture ladened air is admitted to the barrel reactor 10 when the seal plate 28 is moved to open the reaction chamber.

The method may also be carried out by direct examination of the semiconductor wafers W for metals and particulate contaminants in the layer of silicon deposited on the semiconductor wafers. In that event the flow rate of purge gas would be increased until the amount of contaminants detected in the deposited layers of silicon reached a minimum amount acceptable. However, as previously stated, too much purge gas can cause dilution of the reactant gas and reduction in the thickness of the layer of silicon deposited. Therefore, the thickness of the layer of silicon deposited on the semiconductor wafers is also examined so that purge gas flow is not increased to the extent that the layer of silicon becomes too thin to achieve the electrical properties needed for that particular wafer. In practice, large rates of purge gas flow have not been found to adversely affect the thickness of the deposited layer. The upper limit of purge gas flow is most practically determined by the point of diminished returns, where the reduction of metal and particulate contamination is not significantly affected by further increases of purge gas flow.

In a preferred embodiment, for a 7800 barrel reactor manufactured by Applied Materials, Inc. of Santa Clara, Calif., the flow rates for the four purge gas lines are: 15 standard liters per minute (SLM) for the left and right baffle plate purge lines 34, 38; 100 SLM for the rotation housing purge line 36; and 150 SLM for the seal plate purge line 40; for a total purge gas flow rate of 300 SLM. However, it is believed that optimal ranges for the flow rates of the four purge gas lines are: 10–20 SLM for the left and right baffle purge lines 34, 38; 75–150 SLM for the rotation housing purge line 36; and 140–175 SLM for the seal plate purge line 40; for a total flow of 235–365 SLM. The upper boundary for purge gas flow is defined by that flow rate which results in dilution of the reactant gas to the extent that the thickness of the silicon layer deposited on the wafers W is adversely affected. However, it is to be understood that flow rates may be affected by the size of the particular barrel reactor and other factors.

Thus it may be seen that the several objects of the present invention are achieved by the foregoing method for tuning the barrel reactor 10. The presence of metal and particulate contaminates in the deposited layer on the semiconductor wafers W is significantly reduced. For example, it has been found that the concentration of iron in epitaxial silicon layers has been reduced from between about 2.4–2.7 atoms per cubic centimeter using the AMC 7800 barrel reactor without tuning the purge system or employing the gas containment annulus 56, to about 1.5–1.8 atoms per cubic centimeter with the method and apparatus of the present invention. The seal plate 28 and gas ring 22 do not require cleaning as frequently as in the past. Moreover, it has been found that cleaning can be carried out with a dry cloth so that no water is introduced to the seal plate 28 or gas ring 22 in the cleaning process. Accordingly, the barrel reactor 10 may be run for a longer period of time without being shut down for cleaning $SiO_2$ deposits, thereby increasing the throughput of wafers.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method for tuning a purge system of a barrel reactor used to deposit material on a semiconductor wafer by chemical vapor deposition of the material from reactant gases, the barrel reactor including a reaction chamber and a seal plate for closing the reaction chamber, the purge system comprising a plurality of purge gas lines connected to a source of purge gas and at spaced apart locations to the barrel reactor for delivering the purge gas to the barrel reactor to purge the reactant gases and other gases from selected locations within the barrel reactor, the method comprising the steps of:

monitoring the flow rates of purge gas in the purge gas lines;

setting flow rates for the purge gas through the purge gas lines to said locations in the barrel reactor;

monitoring the presence of oxygen in the barrel reactor at a time after the purge gas has begun flowing into the barrel reactor;

selectively adjusting the flow rate of purge gas in at least one purge gas line based on the oxygen measured in the barrel reactor to reduce the presence of oxygen in the barrel reactor, the adjustment being made to a nonzero flow rate.

2. A method as set forth in claim 1 wherein said step of setting first flow rates includes the step of adjusting the purge gas flow rate to achieve purge gas flow in a direction toward the barrel reactor in all of the purge gas lines.

3. A method as set forth in claim 2 further comprising the steps of:

placing flow meters in the purge gas lines; and placing adjustable flow regulators in the purge gas lines;

and wherein the step of selectively adjusting the flow rates of the purge gas comprises the step of adjusting at least one of the adjustable flow regulators.

4. A method as set forth in claim 3 wherein the step of monitoring the presence of oxygen in the barrel reactor comprises the steps of:

operating the barrel reactor to deposit material on the semiconductor wafers;

inspecting the barrel reactor for the presence of oxygen containing reaction products.

5. A method as set forth in claim 4 wherein the step of inspecting the barrel reactor comprises the step of inspecting the barrel reactor for the presence of $SiO_2$.

6. A method as set forth in claim 5 wherein one of said locations which purge gas is delivered to the barrel reactor is in an annular seal plate purge groove extending around the seal plate, and wherein the method further comprises the step of holding the purge gas in the seal plate purge groove to travel around the full length of the seal plate purge groove.

7. A method as set forth in claim 6 wherein the step of holding the purge gas in the seal plate purge groove comprises the steps of providing an annulus sized for reception in the seal plate purge groove for substantially closing the seal plate purge groove and inserting the annulus into the seal plate purge groove.

8. A method as set forth in claim 1 further comprising the steps of:

placing flow meters in the purge gas lines; and placing adjustable flow regulators in the purge gas lines;

and wherein the step of selectively adjusting the flow rates of the purge gas comprises the step of adjusting at least one of the adjustable flow regulators.

9. A method as set forth in claim 1 wherein the step of monitoring the presence of oxygen in the barrel reactor comprises the steps of:

operating the barrel reactor to deposit material on the semiconductor wafers;

inspecting the barrel reactor for the presence of oxygen containing reaction products.

10. A method as set forth in claim 9 wherein the step of inspecting the barrel reactor comprises the step of inspecting the barrel reactor for the presence of $SiO_2$.

11. A method as set forth in claim 1 wherein one of said locations which purge gas is delivered to the barrel reactor is in an annular seal plate purge groove extending around the seal plate, and wherein the method further comprises the step of holding the purge gas in the seal plate purge groove to travel around the full length of the seal plate purge groove.

12. A method as set forth in claim 11 wherein the step of holding the purge gas in the seal plate purge groove comprises the steps of providing an annulus sized for reception in the seal plate purge groove for substantially closing the seal plate purge groove and inserting the annulus into the seal plate purge groove.

13. A method for tuning a purge system of a barrel reactor used to deposit material on a semiconductor wafer by chemical vapor deposition of the material from reactant gases, the material being deposited in a layer having a thickness, the barrel reactor including a reaction chamber and a seal plate for closing the reaction chamber, the purge system comprising a plurality of purge gas lines connected to a source of purge gas and at spaced apart locations to the barrel reactor for delivering the purge gas to the barrel reactor to purge the reactant gases and other gases from selected locations within the barrel reactor, the method comprising the steps of:

monitoring the flow rates of purge gas in the purge gas lines;

setting flow rates for the purge gas through the purge gas lines to said locations in the barrel reactor;

operating the barrel reactor to deposit material on the semiconductor wafer;

examining the semiconductor wafer on which material has been deposited for the presence of particulate contaminants in the layer of material deposited;

selectively adjusting the flow rate of purge gas in at least one purge gas line based on the level of particulate contamination in the deposited layer of material on the semiconductor wafer.

14. A method as set forth in claim 13 further wherein the step of selectively adjusting the flow rate of purge gas comprises the step of selectively increasing the flow rate of purge gas in at least one purge gas line to reduce with level of particulate contamination.

15. A method as set forth in claim 14 further comprising the steps of examining the semiconductor wafer for substantial variation in thickness of the layer of material deposited and decreasing the flow rate of purge gas when substantial variation of the thickness of the layer of material is detected.

16. A method as set forth in claim 13 wherein said step of setting first flow rates includes the step of adjusting the purge gas flow rate to achieve purge gas flow in a direction toward the barrel reactor in all of the purge gas lines.

17. A barrel reactor for depositing material from a reactant gas onto a semiconductor wafer by chemical vapor deposition, the barrel reactor comprising:

a reaction chamber having an open top sized for receiving at least one semiconductor wafer into the chamber;

a gas ring generally surrounding the open top of the reaction chamber;

reactant gas delivery means associated with the gas ring for delivering reactant gas to the reaction chamber;

a plurality of purge gas lines for delivery of purge gas to the seal plate;

a seal plate adapted to sealingly close the open top of the reaction chamber for sealing the reaction chamber from the environment, the seal plate including a seal engageable with the gas ring and an annular groove therein extending around the center of the seal plate and generally aligned with the gas ring, one of the purge gas lines being disposed for delivering purge gas to the annular groove;

purge gas containment means received in the annular groove for containing purge gas to travel from the location where the purge gas line delivering purge gas to the annular groove enters the groove around the full length of the groove.

18. A barrel reactor as set forth in claim 17 wherein said purge gas containment means comprises an annulus having a generally U-shaped cross section, the annulus being sized in correspondence to the annular groove in the seal plate.

19. A barrel reactor as set forth in claim 17 wherein each purge gas line includes a flow meter and an adjustable flow regulator for selectively adjusting the flow rate of purge gas to reduce the oxygen present in the barrel reactor.

* * * * *